US012794459B2

(12) United States Patent
Asam

(10) Patent No.: US 12,794,459 B2
(45) Date of Patent: Nov. 10, 2026

(54) OPEN-DRAIN REPEATER WITH EDGE ACCELERATOR FOR I2C APPLICATION

(71) Applicant: NEXPERIA B.V, Nijmegen (NL)

(72) Inventor: Geethanadh Asam, Nijmegen (NL)

(73) Assignee: Nexperia B.V., Nijmegen (NL)

( * ) Notice: Subject to any disclaimer, the term of this patent is extended or adjusted under 35 U.S.C. 154(b) by 0 days.

(21) Appl. No.: 18/966,545

(22) Filed: Dec. 3, 2024

(65) Prior Publication Data

US 2025/0183880 A1 Jun. 5, 2025

(30) Foreign Application Priority Data

Dec. 5, 2023 (EP) .................................... 23214456

(51) Int. Cl.
*H03K 5/01* (2006.01)

(52) U.S. Cl.
CPC .................................... *H03K 5/01* (2013.01)

(58) Field of Classification Search
CPC ........................................................ H03K 5/01
USPC ................................................. 327/108–112
See application file for complete search history.

(56) References Cited

U.S. PATENT DOCUMENTS

2009/0031065 A1* 1/2009 Travers ................... H04L 1/243
710/110
2022/0385290 A1* 12/2022 Nowak ............ H03K 19/01742

FOREIGN PATENT DOCUMENTS

| | | | |
|---|---|---|---|
| EP | 2555122 | A2 | 2/2013 |
| EP | 4099570 | A1 | 12/2022 |
| WO | 2009013008 | A2 | 1/2009 |

OTHER PUBLICATIONS

Extended European search report for corresponding European patent application EP23214456.8, 12 pages, dated Jun. 24, 2024.

* cited by examiner

*Primary Examiner* — Tomi Skibinski
(74) *Attorney, Agent, or Firm* — Ruggiero McAllister & McMahon LLC

(57) ABSTRACT

An I2C repeating unit has an A-side and a B-side terminal and is operable in a first mode for receiving a signal at the A-side terminal and producing a signal at the B-side terminal based on the A-side signal. The repeating unit further has a B-side rise time accelerator element and a controller unit configured to, in the first mode, control the B-side rise time accelerator element to pull up a voltage at the B-side terminal when the voltage at the A-side terminal surpasses a first threshold voltage during a rising edge of the voltage, and to subsequently control the B-side rise time accelerator element to stop pulling up the voltage at the B-side terminal when the voltage at the B-side terminal surpasses a second threshold voltage. The controller unit is further configured to disable the B-side rise time accelerator element when sending or receiving a handshake bit.

15 Claims, 11 Drawing Sheets

700

900

OPEN-DRAIN REPEATER WITH EDGE ACCELERATOR FOR I2C APPLICATION

CROSS-REFERENCE TO RELATED APPLICATIONS

This application claims priority under 35 U.S.C. § 119 to European patent application EP 23214456.8, filed Dec. 5, 2023, the entire disclosure of which is incorporated herein by reference.

BACKGROUND OF THE DISCLOSURE

1. Field of the Disclosure

The present disclosure generally relates to a repeater for open-drain bus communication and a system comprising the same. More particularly, the present disclosure relates to a repeater that is suitable for inter-integrated circuit (I2C) bus communication.

2. Description of Related Art

Hereinafter, an open-drain bus refers to a bus to which devices are connected using open-drain output drivers.

Data communication between devices in a system can be performed using a bus connection. For example, a device can communicate with another device using an open-drain bus connection based on the I2C communication protocol.

FIG. 1 illustrates a known system 100, comprising a first communication unit 110 and a second communication unit 120 that are connected using a bus connection 101. Bus connection 101 comprises a first segment 102 comprising a first bus line 102*a* and a second segment 103 comprising a second bus line 103*a* that are connected using an I2C bus repeater 130. First bus line 102*a* and second bus line 103*a* each have a routing capacitance associated therewith, denoted by C1 and C2, respectively. It should be noted that, typically, first segment 102 and second segment 103 each comprise a plurality of bus lines, e.g., a data bus line and a clock bus line.

First segment 102 further comprises a first pull-up resistor R1 connected in between first bus line 102*a* and a supply voltage Vcc. Similarly, second segment 103 further comprises a second pull-up resistor R2 connected in between second bus line 103*a* and supply voltage Vcc.

First communication unit 110 comprises a first I2C controller 111 that controls a first pull-down transistor 112 connected in between first bus line 102*a* and ground. Similarly, second communication unit 120 comprises a second controller 121 that controls a second pull-down transistor 122 connected in between second bus line 103*a* and ground.

For each pair of bus lines 102*a*, 103*a*, bus repeater 130 comprises a repeating unit 140. Repeating unit 140 has an A-side terminal 141*a* and a B-side terminal 141*b*. Each repeating unit 140 further comprises an A-to-B buffer 142*a* having its input connected to A-side terminal 141*a* and its output connected to a controlling input of a B-side pull-down transistor 143*b*, which transistor is arranged in between B-side terminal 141*b* and ground. Repeating unit 140 further comprises a B-to-A buffer 142*b* having its input connected to B-side terminal 141*b* and its output connected to a controlling input of an A-side pull-down transistor 143*a*, which transistor is arranged in between A-side terminal 141*a* and ground.

Each repeating unit 140 is configured to be operable in a first mode, in which repeating unit 140 receives a signal at A-side terminal 141*a* and produces a signal at B-side terminal 141*b* based on the signal received at A-side terminal 141*a*. However, repeating unit 140 can be bidirectional, as shown in FIG. 1. In that case, repeating unit can also be configured to be operable in a second mode, in which repeating unit 140 receives a signal at B-side terminal 141*b* and produces a signal at A-side terminal 141*a* based on the signal received at B-side terminal 141*b*.

Hereinafter, a statement referring to pulling up a voltage and a statement referring to pulling up a node at which this voltage is provided are assumed identical.

Bus connection 101 is an open-drain type bus, having a high idle state. In particular, in absence of pull-down by first pull-down transistor 112 and A-side pull-down transistor 143*a*, a voltage on first bus line 102*a* is pulled up by first pull-up resistor R1. More in particular, a current through pull-up resistor R1 charges capacitance C1 until the voltage on first bus line 102*a* is pulled up to supply voltage Vcc, which voltage corresponds to a logic 'high' voltage (VH). Similarly, in absence of pull-down by second pull-down transistor 122 and B-side pull-down transistor 143*b*, a voltage on second bus line 103*a* is pulled up to supply voltage Vcc by second pull-up resistor R2.

First communication unit 110 can transfer data to second communication unit 120 over bus connection 101 by changing the voltage on first bus line 102*a*. In particular, if a logic 'low' voltage (VL) signal is to be transmitted over bus connection 101, then first communication unit 110 controls first pull-down transistor 112, using first I2C controller 111, to pull down the voltage on first bus line 102*a*. On the other hand, if a VH signal is to be transmitted, then first I2C controller 111 deactivates first pull-down transistor 112 to allow the voltage on first bus line 102*a* to be pulled up by first pull-up resistor R1.

If first communication unit 110 is transferring data to second communication unit 120, then repeating unit 140 operates in the first mode. The voltage on first bus line 102*a* is received by repeating unit 140 at A-side terminal 141*a*. A-to-B buffer 142*a* controls B-side pull-down transistor 143*b* based on the voltage at A-side terminal 141*a* to reproduce the signal received at A-side terminal 141*a*. In particular, if a VL signal is received at A-side terminal 141*a*, then A-to-B buffer 142*a* activates B-side pull-down transistor 143*b* so that the voltage at B-side terminal 141*b*, and therefore the voltage on second bus line 103*a*, is pulled down. On the other hand, if a VH signal is received at A-side terminal 141*a*, then A-to-B buffer 142*a* deactivates B-side pull-down transistor 143*b* to allow the voltage at B-side terminal 141*b*, and therefore the voltage on second bus line 103*a*, to be pulled up by second pull-up resistor R2.

The operation of system 100 is bi-directional. More in particular, data communication is also possible from second communication unit 120 to first communication unit 110 in a manner similar to that described above. In that case, repeating unit 140 operates in the second mode.

The time required for the voltage on a bus line to change from VL to VH (i.e., 'rise time') depends on a time constant formed by a capacitance of the bus line and the resistance of the corresponding pull-up resistor. Typically, a voltage transition from VL to VH will therefore occur in an exponentially rising manner.

To decrease the rise time for the voltage on second bus line 103*a*, repeating unit 140 of known system 100 comprises an accelerator element 144. This accelerator element comprises a current source connected to B-side terminal 141*b*. This current source provides an extra charge current thereby decreasing the time to charge the bus capacitance.

In open-drain bus communication systems, when operating in the first mode, second communication unit 120 can communicate to first communication unit 110 by means of pulling down the voltage on bus line 103*a*. Designing detection circuitry for detecting such pulldown can be complicated when using the known bus repeater, and that the use of this bus repeater puts constraints on the overall system implementation.

SUMMARY OF THE DISCLOSURE

A summary of aspects of certain examples disclosed herein is set forth below. It should be understood that these aspects are presented merely to provide the reader with a brief summary of certain embodiments and that these aspects are not intended to limit the scope of this disclosure. Indeed, this disclosure can encompass a variety of aspects and/or a combination of aspects that may not be set forth.

The present disclosure presents an improvement over known open-drain bus communication systems, such as the open-drain system 100 of FIG. 1. In particular, an improved open-drain repeater with an edge accelerator for I2C communication is presented that advantageously resolves a potential bus stuck during I2C communication, thereby guaranteeing higher load capacitance.

According to an aspect of the present disclosure, a repeating unit for open-drain bus communication is presented. The repeating unit can include an A-side terminal configured to be electrically connected to an A-side open-drain bus line. The repeating unit can further include a B-side terminal configured to be electrically connected to a B-side open-drain bus line. The repeating unit can be operable in a first mode in which the repeating unit is configured to receive a signal at the A-side terminal and to produce a signal at the B-side terminal based on the signal received at the A-side terminal. The repeating unit can further include a B-side rise time accelerator element electrically connected to the B-side terminal. The repeating unit can further include a controller unit. The controller unit can be configured to, when the repeating unit is operating in the first mode, control the B-side rise time accelerator element to pull up a voltage at the B-side terminal when the voltage at the A-side terminal surpasses a first threshold voltage during a rising edge of the voltage, and to subsequently control the B-side rise time accelerator element to stop pulling up the voltage at the B-side terminal when the voltage at the B-side terminal surpasses a second threshold voltage. The controller unit can further be configured to disable the B-side rise time accelerator element when sending or receiving a handshake bit.

In an embodiment, the repeating unit can be operable in a second mode in which the repeating unit is configured to receive a signal at the B-side terminal and to produce a signal at the A-side terminal based on the signal received at the B-side terminal. The repeating unit can further include an A-side rise time accelerator element electrically connected to the A-side terminal. The controller unit can be configured to, when the repeating unit is operating in the second mode, control the A-side rise time accelerator element to pull up a voltage at the A-side terminal when the voltage at the B-side terminal surpasses a third threshold voltage during a rising edge of the voltage, and to subsequently control the A-side rise time accelerator element to stop pulling up the voltage at the A-side terminal when the voltage at the A-side terminal surpasses a fourth threshold voltage. The controller unit can further be configured to disable the A-side rise time accelerator element when sending or receiving a handshake bit.

In an embodiment, the repeating unit can further include a direction control element. The controller unit can be configured to determine whether the repeating unit is operating in the first mode or the second mode. The controller unit can be configured to control the direction control element to block communication from the B-side terminal to the A-side terminal in the first mode and block communication from the A-side terminal to the B-side terminal in the second mode.

In an embodiment, the repeating unit can be an I2C repeating unit.

According to an aspect of the present disclosure, a bus repeater is presented. The bus repeater can include one or more repeating units having one or more of the above-described features.

According to an aspect of the present disclosure, a system is presented. The system can include a bus repeater as described above. The system can further include a first communication unit. The system can further include a second communication unit. An A-side terminal of a first repeating unit can be connected to a data pin of the first communication unit via a first bus line. A B-side terminal of the first repeating unit can be connected to a data pin of the second communication unit via a second bus line. An A-side terminal of a second repeating unit can be connected to a clock pin of the first communication unit via a third bus line. A B-side terminal of the second repeating unit can be connected to a clock pin of the second communication unit via a fourth bus line.

According to an aspect of the present disclosure, a method of transmitting a handshake in an inter-integrated circuit, I2C, based communication in a repeating unit is proposed. The repeating unit can include an A-side terminal acting as Master and a B-side terminal acting as a Slave. The method can include determining that a handshake is to be performed from Master to Slave. The method can further include, if such has been determined, blocking communication from Master to Slave and blocking edge acceleration of signals on the A-side terminal and the B-side terminal of the repeating unit.

In an embodiment, the method can further include, after blocking the edge acceleration, monitoring a status of the B-side terminal and enable Slave to Master propagation. If the B-side terminal is not driven from Slave, a high signal can be sent on the A-side terminal. If the B-side terminal is driven from Slave, a low signal can be sent to the A-side terminal and determine that an acknowledgement is detected from Slave.

In an embodiment, the method can further include determining that a handshake is to be performed from Slave to Master. The method can further include, if such has been determined, blocking communication from Slave to Master and blocking edge acceleration of signals on the A-side terminal and the B-side terminal of the repeating unit.

In an embodiment, the method can further include, after blocking the edge acceleration, monitoring a status of the A-side terminal and enable Master to Slave propagation. If the A-side terminal is not driven from Master, a high signal can be sent on the B-side terminal. If the A-side terminal is driven from Master, a low signal can be sent to the B-side terminal.

In an embodiment, the method my further include, after blocking the edge acceleration, expiring a delay timer before monitoring the status of the A-side terminal or the B-side terminal. The delay timer is, e.g., set to 160 ns.

BRIEF DESCRIPTION OF THE DRAWINGS

Embodiments of the present disclosure will now be described, by way of example only, with reference to the accompanying schematic drawings in which corresponding reference symbol indicate corresponding parts.

Figure 1:
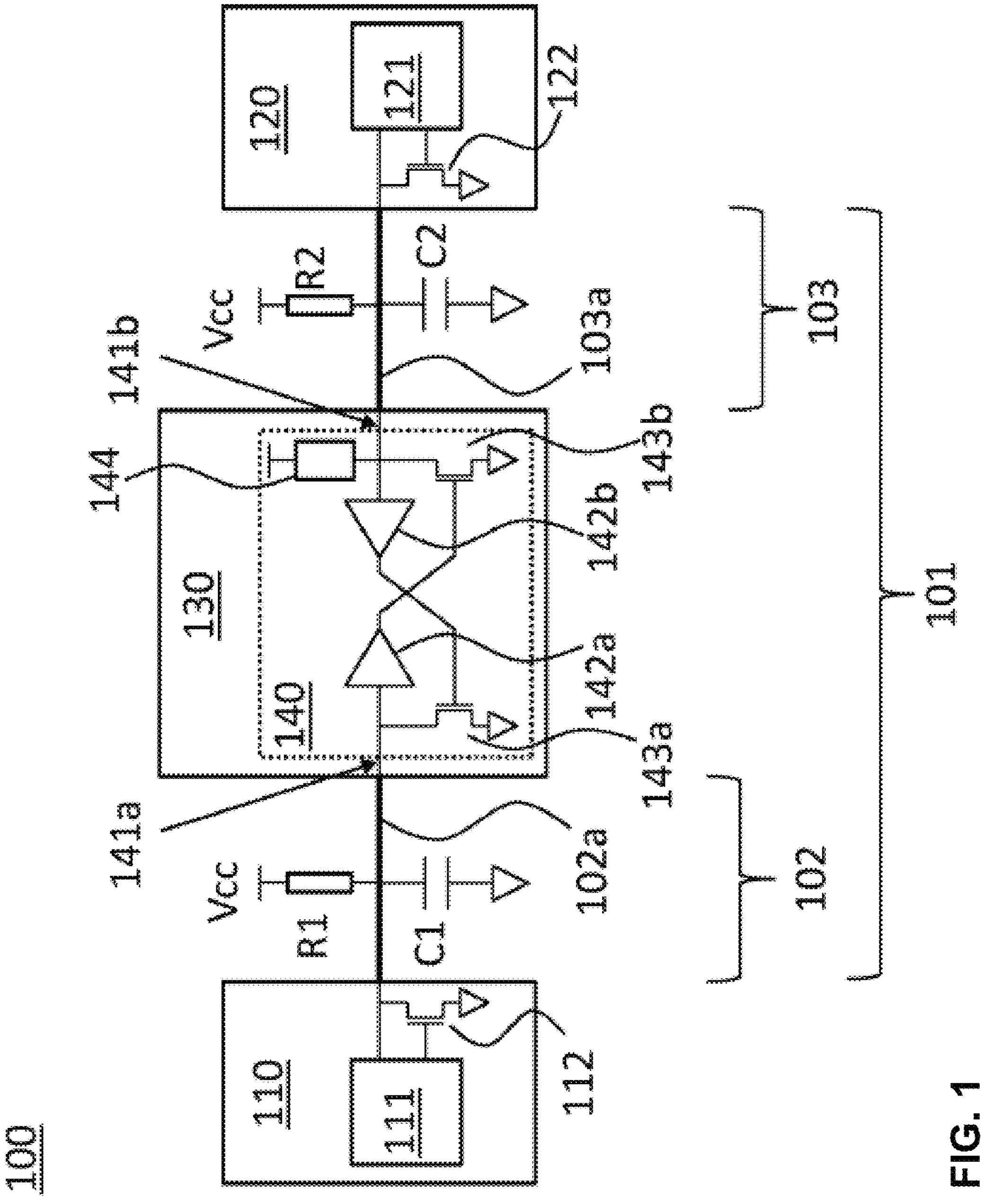
FIG. 1 (Prior Art)
FIG. 1 is a schematic diagram of an open-drain communication system known in the art.

The figures are intended for illustrative purposes only and do not serve as a restriction of the scope of the protection as laid down by the claims.

DETAILED DESCRIPTION OF THE DISCLOSURE

It will be readily understood that the components of the embodiments, as generally described herein and illustrated in the appended figures, could be arranged and designed in a wide variety of different configurations. Thus, the following more detailed description of various embodiments, as represented in the figures, is not intended to limit the scope of the present disclosure but is merely representative of various embodiments. While the various aspects of the embodiments are presented in drawings, the drawings are not necessarily drawn to scale unless specifically indicated.

The described embodiments are to be considered in all respects only as illustrative and not restrictive. The scope of the present disclosure is, therefore, indicated by the appended claims rather than by this detailed description. All changes that come within the meaning and range of equivalency of the claims are to be embraced within their scope.

Reference throughout this specification to features, advantages, or similar language does not imply that all of the features and advantages that can be realized with the present disclosure should be or are in any single example of the present disclosure. Rather, language referring to the features and advantages is understood to mean that a specific feature, advantage, or characteristic described in connection with an embodiment is included in at least one embodiment of the present disclosure. Thus, discussions of the features and advantages, and similar language, throughout this specification can, but do not necessarily, refer to the same example.

Furthermore, the described features, advantages, and characteristics of the present disclosure can be combined in any suitable manner in one or more embodiments. One skilled in the relevant art will recognize, in light of the description herein, that the present disclosure can be practiced without one or more of the specific features or advantages of a particular embodiment. In other instances, additional features and advantages can be recognized in certain embodiments that are not present in all embodiments of the present disclosure. Reference throughout this specification to "one embodiment," "an embodiment," or similar language means that a particular feature, structure, or characteristic described in connection with the indicated embodiment is included in at least one embodiment of the present disclosure. Thus, the phrases "in one embodiment," "in an embodiment," and similar language throughout this specification can, but do not necessarily, all refer to the same embodiment.

I2C repeating units typically use open drain drivers to accelerate signals using pull-up resistors. The communication of the signals can thus be improved by compromising power consumption, hence high performance with low power consumption can be a challenging design characteristic. This is even more challenging in higher load capacitance applications.

In an I2C communication, the acknowledgement (ACK) interface bits include the ACK bit(s) and the first bit of a new byte. The I2C protocol ends each byte of transfer with an ACK bit from the receiver end. As will be further explained, a rise time accelerator can compete against the open drain driver from Master or Slave, which can cause bus stuck leading to shoot through current from Supply (VCC) to Ground. The present disclosure focuses on resolving bus stuck during I2C communication, thereby enabling higher load capacitance.

The present disclosure presents a controller unit of a repeating unit that enables a smart acceleration of the input signal edge when necessary and disables the acceleration of the output signal edge to avoid bus stuck. This enables signal integrity on both input and output signals.

Hereto, the controller unit of the present disclosure can detect handshake bits and disable edge acceleration during the handshake bits. The controller unit can include a clock pulse counter and start-stop detection for counting clock pulses from a clock input signal 290 after a start condition on a serial data (SDA) signal. The clock input signal 290 can be a serial clock signal (SCL) for the Master, which can also be referred to as SCLA. The controller unit can further detect the direction of propagation, enabling the controller unit to control the rise time accelerators depending on the direction of signal propagation being from Master to Slave or from Slave to Master. The controller unit can include an optional timer to further control the direction of propagation during ACK interface bits. The solution of the present disclosure will be further explained in the following.

Figure 2:
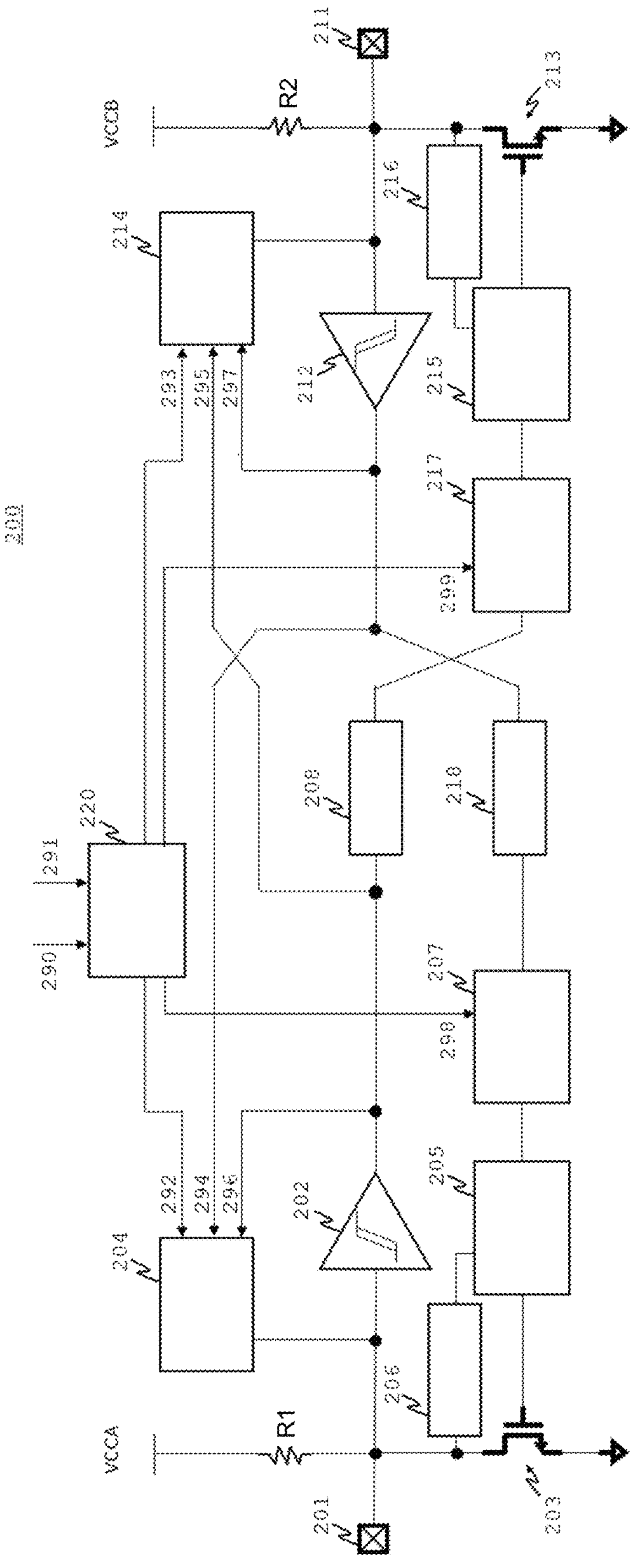
FIG. 2 is a schematic diagram of a repeating unit of a repeater according to an embodiment of the present disclosure.

In FIG. 2, a repeating unit 200 of a repeater for open-drain bus communication according to the present disclosure is shown. The repeater can comprise at least one repeating unit 200, as shown in FIG. 2.

Repeating unit 200 comprises an A-side terminal 201 and a B-side terminal 211. A-side terminal 201 is configured to be electrically connected to a first communication unit using a first bus line (e.g., an A-side open-drain bus). Similarly, B-side terminal 211 is configured to be electrically connected to a second communication unit using a second bus line (e.g., a B-side open-drain bus). The first communication unit can communicate with the second communication unit via the bus connection formed by the first bus line, repeating unit 200 and the second bus line. In particular, the first communication unit can transfer data to the second communication unit by providing a voltage signal, such as a logic 'high' voltage signal (VH) or a logic 'low' voltage signal (VL), to A-side terminal 201 of repeating unit 200 via the first bus line. This voltage signal is then repeated at B-side terminal 211 by repeating unit 200. Then, the second communication unit can receive the voltage signal provided by the first communication unit from B-side terminal 211 of repeating unit 200 via the second bus line.

Repeating unit 200 comprises an A-to-B buffer 202, a B-side pull-down control unit 215, and a B-side pull-down element 213 arranged between B-side terminal 211 and the B-side ground reference terminal. A-to-B buffer 202 receives the voltage signal at A-side terminal 201 and generates a first buffered voltage signal. The first buffered voltage signal can then be provided to B-side pull-down control unit 215. However, in some embodiments, the first buffered voltage signal can be provided to controller unit 220 for a direction (DIR) detection and/or an ACK detection, as will be described further below.

B-side pull-down control unit 215 is configured to control B-side pull-down element 213 based on the received buffered signal. For example, if the received buffered voltage signal is indicative of a VH signal received at A-side terminal 201, then B-side pull-down control unit 215 does not activate B-side pull-down element 213, so that a voltage at B-side terminal 211 is pulled up to or remains at VH. On the other hand, if the received buffered voltage signal is indicative of a VL signal at A-side terminal 201, then B-side pull-down control unit 215 generates a first control signal to control B-side pull-down element 213 to pull down the voltage at B-side terminal 211. For example, B-side pull-down element 213 is a pull-down transistor that is configured to pull down the voltage at B-side terminal 211 by sinking a charge of the B-side bus line capacitance based on its gate or base voltage. The gate or base voltage is controlled by the first control signal generated by B-side pull-down control unit 215. B-side pull-down element 213 is, for example, an n-type metal-oxide-semiconductor (NMOS) transistor.

In the absence of pull-down, the voltage at B-side terminal 211 is pulled up to a B-side supply voltage VCCB by a pull-up resistor, such as a B-side pull-up resistor R2 and/or another pull-up resistor connected to the second bus line externally to repeating unit 200. On the other hand, if the voltage at, for example, A-side terminal 201 is pulled down by the first communication unit, then, in order to repeat the signal at B-side terminal 211, B-side pull-down element 213 is controlled by B-side pull-down control unit 215 to pull down the voltage at B-side terminal 211 to VL.

For example, B-side pull-down element 213 can be connected to a B-side reference voltage, such as ground, and can thus pull down the voltage at B-side terminal 211 towards the B-side reference voltage. However, since the (possibly external) pull-up resistor continuously pulls up the voltage at B-side terminal 211, VL can be greater than the B-side reference voltage. In other words, the logic 'low' voltage level VL depends on a pull-down strength of B-side pull-down element 213, and a pull-up strength of the (external) pull-up resistor. The pull-down strength of B-side pull-down element 213 is controlled by B-side pull-down control unit 215 using the first control signal.

During a transition from VL to VH at B-side terminal 211, the voltage at B-side terminal 211 will increase in an exponentially rising manner based on a time constant of the capacitance of the second bus line in combination with the resistance of the corresponding pull-up resistor. In particular, a current through the pull-up resistor, which current charges the capacitor, will decrease as the voltage at B-side terminal 211 increases. In other words, the rise time at B-side terminal 211, and therefore also the maximum reliable communication rate, is generally dictated by the time constant.

The rise time can be improved by decreasing the resistance of the pull-up resistor. However, this will inherently require B-side pull-down element 213 to have a greater pull-down strength if the same VL level is desired, resulting in an increase in power consumption of repeating unit 200. Consequently, there is a trade-off between the maximum communication rate and the power consumption of the repeater.

To further improve the rise and fall time performance independently of the selected pull-up resistance, repeating unit 200 further comprises a B-side accelerator element 214 electrically connected to B-side terminal 211, and a first control unit configured to control the B-side accelerator element 214 to pull up the voltage at B-side terminal 211. In the example of FIG. 2, the first control unit is integrated with the B-side accelerator element 214, but it can be external to the B-side accelerator element 214. For example, when repeating unit 200 operates in the first mode, the first control unit of the B-side accelerator element 214 determines whether a transition from VL to VH occurs at A-side terminal 201 and activates B-side accelerator element 214 during at least a portion of the transition from VL to VH at B-side terminal 211.

A B-side slew rate control unit 216 can further improve the slew rate of the signal, as will be further explained below.

Repeating unit 200, as shown in FIG. 2, is bidirectional. That is, repeating unit 200 can be operable in the first mode as well as a second mode in which repeating unit 200 receives a voltage signal at B-side terminal 211 and repeats the voltage signal at A-side terminal 201. To this end, repeating unit 200 comprises a B-to-A buffer 212, a A-side pull-down control unit 205, and a A-side pull-down element 203 arranged sequentially between B-side terminal 211 and A-side terminal 201. An operation of B-to-A buffer 212, A-side pull-down control unit 205, and A-side pull-down element 203 can be similar or identical to the operation of A-to-B buffer 202, B-side pull-down control unit 215, and B-side pull-down element 213. Therefore, a detailed description thereof is omitted.

Furthermore, repeating unit 200 can comprise an A-side pull-up resistor R1 connected between an A-side supply voltage VCCA and A-side terminal 201. Additionally or alternatively, an external pull-up resistor can be connected to first bus line. The voltage at A-side terminal 201 is pulled up by the pull-up resistor.

Repeating unit 200 further comprises a direction detection to determine whether repeating unit 200 is operating in the first mode or the second mode and to control A-side pull-down control unit 205 and/or B-side pull-down control unit 215 accordingly. For direction detection and in accordance with I2C specifications, one of the A-side and B-side can be operating in Master mode, while the other side can be operating in Slave mode. In the following examples, the A-side operates in Master mode and the B-side operates in Slave mode.

For example, with the A-side operating in Master mode, the controller unit 220 can receive an input signal 291 similar or identical to the signal at the A-side terminal 201 or similar or identical to the first buffered signal from A-to-B buffer 202 and determine based on the input signal 291 whether repeating unit 200 is operating in the first mode or in the second mode. Depending on the determined mode of operation, a direction control (DIR_CTRL) signal 298, 299 can trigger an A-side and B-side direction control element 207, 217, respectively. The direction control elements 207, 217 can be implemented as anti self locking flipflops.

For example, if a voltage transition occurs at A-side terminal 201, then it can be determined, based on the input signal 291, that repeating unit 200 is operating in the first mode. Accordingly, the DIR_CTRL signal 299 signals the B-side direction control element 217 to enable B-side pulldown control unit 215. Furthermore, the DIR_CTRL signal 298 signals the A-side direction control element 207 to disable A-side pull-down control unit 205, because the voltage at A-side terminal 201 should be controlled by the first communication unit rather than by repeating unit 200. In other words, in the first mode, A-side pull-down control unit 205 and A-side pull-down element 203 are disabled, and, in the second mode, B-side pull-down control unit 215 and B-side pull-down element 213 are disabled.

First and second supply voltage VCCA, VCCB can be an identical DC voltage, or can be different DC voltages. The latter can be required when the first communication unit operates based on a different voltage range compared to the second communication unit. For example, the first communication unit can require a VL level of 0.1 V and a VH level of 1 V, while the second communication unit can require a VL level of 0.3 V and a VH level of 3.3 V. In that case, for example, a VH signal provided by the first communication unit may not be recognized as a VH signal by the first communication unit. To remedy this, A-side terminal 201 can have an A-side logic 'high' voltage level VHa based on supply voltage VCCA, and B-side terminal 211 can have a B-side logic 'high' voltage level VHb based on supply voltage VCCB. A logic 'low' voltage level VLa, VLb at A-side and B-side terminal 201, 211, respectively, can depend on the pull-up strength of the corresponding pull-up resistor and the pull-down strength of the corresponding pull-down element.

Repeating unit 200 can further comprise an A-to-B level shifter 208 and a B-to-A level shifter 218 if first supply voltage VCCA differs from second supply voltage VCCB. A-to-B level shifter 208 receives a first buffered signal from A-to-B buffer 202 and outputs a voltage signal having a different voltage range with respect to the received first buffered signal. Similarly, B-to-A level shifter 218 receives a second buffered signal from B-to-A buffer 212 and outputs a signal having a different voltage range with respect to the received second buffered signal.

For example, the first buffered signal is a voltage signal between the A-side ground reference voltage received at the A-side ground reference terminal and A-side supply voltage VCCA, and the voltage signal outputted by A-to-B level shifter 208 is a voltage between the B-side ground reference voltage received at the B-side ground reference terminal and B-side supply voltage VCCB. Similarly, the second buffered signal can be a voltage signal between the B-side ground reference voltage received at the B-side ground reference terminal and B-side supply voltage VCCB, and the voltage signal outputted by B-to-A level shifter 218 can be a voltage between the A-side ground reference voltage received at the A-side ground reference terminal and A-side supply voltage VCCA.

Repeating unit 200, according to FIG. 2, further comprises an A-side accelerator element 204 electrically connected to A-side terminal 201 with a second control unit configured to control the A-side accelerator element 204 to pull up the voltage at A-side terminal 201. A-side accelerator element 204 can be identical or similar to B-side accelerator element 214 and can include a second control unit identical or similar to first control unit of the B-side accelerator element 214.

Repeating unit 200 can further include an A-side slew rate control unit 206, similar to the B-side slew rate control unit 216.

A-side and B-side accelerator element 204, 214 can each comprise a voltage-controlled current source. For example, B-side accelerator element 214 can comprise a p-type MOS (PMOS) transistor connected between second supply voltage VCCB and B-side terminal 211, and the first control unit of the B-side accelerator element 214 can control a gate voltage thereof. Similarly, A-side accelerator element 204 can comprise a PMOS transistor connected between first supply voltage VCCA and A-side terminal 201 with a second control unit for controlling a gate voltage thereof. As a result, each of A-side accelerator element 204 and B-side accelerator element 214 can, upon being activated, generate a substantially constant current for charging the bus line capacitance while operating in saturation.

Furthermore, the current generated by A-side and B-side accelerator element 204, 214 can substantially exceed the current through the pull-up resistors connected to the same bus line, particularly as the voltage on the bus line increases. As a result, the rise time at A-side terminal 201 and/or B-side terminal 211 can be reduced significantly.

The block diagram of FIG. 2 can describe an I2C repeating unit 200 of a repeater system including two channels, a forward channel translating and buffering signal from the A-side terminal 201 to the B-side terminal 211 and a backward channel translating and buffering signal from the B-side terminal 211 to the A-side terminal 201.

As described above, the forward channel can include an A-side input buffer 202, an A-side level shifter 208, a B-side anti self locking flipflop 217, a B-side pull-down element 213 and a B-side slew rate control unit 216. The A-side input buffer 202 can include a Schmitt trigger, which on input converts slow the rising signal to a buffered signal and provides input to the A-side level shifter 208. The A-side level shifter 208 translates the signal in the VCCA domain to the VCCB domain. The A-side level shifter 208 output can be fed to the B-side anti self locking flipflop 217, which prevents self locking. The output of the B-side anti self locking flipflop 217 can be an input to the B-side pull-down network comprising the B-side pull-down control unit 215 and the B-side pull-down element 213. The pull-down network together with B-side slew rate control unit 216 controls the fall time on the output guaranteeing minimum fall time to meet I2C specifications.

The backward channel is a symmetric to the forward channel and is responsible for translating signals from the B-side terminal 211 to the A-side terminal 201.

The I2C repeating unit 200 can include two rise time accelerator elements 204, 214, one on the A-side terminal 201 and another on the B-side terminal 211. The rise time accelerator elements 204, 214 can be configured to turn on only during low to high transitions and boost the signals till they reach a second threshold voltage, e.g., 80% of VCCA or VCCB, respectively. The rise time accelerator elements 204, 214 can be configured to turn on after being triggered. In a first example, it can be triggered by the terminal voltage rising from low to high and crossing a first threshold voltage, e.g., 42.5% of VCCA or VCCB. In a second example, it can be triggered by detecting opposite port rising between the A-side and the B-side from low to high and crossing the first threshold voltage.

Figure 3:
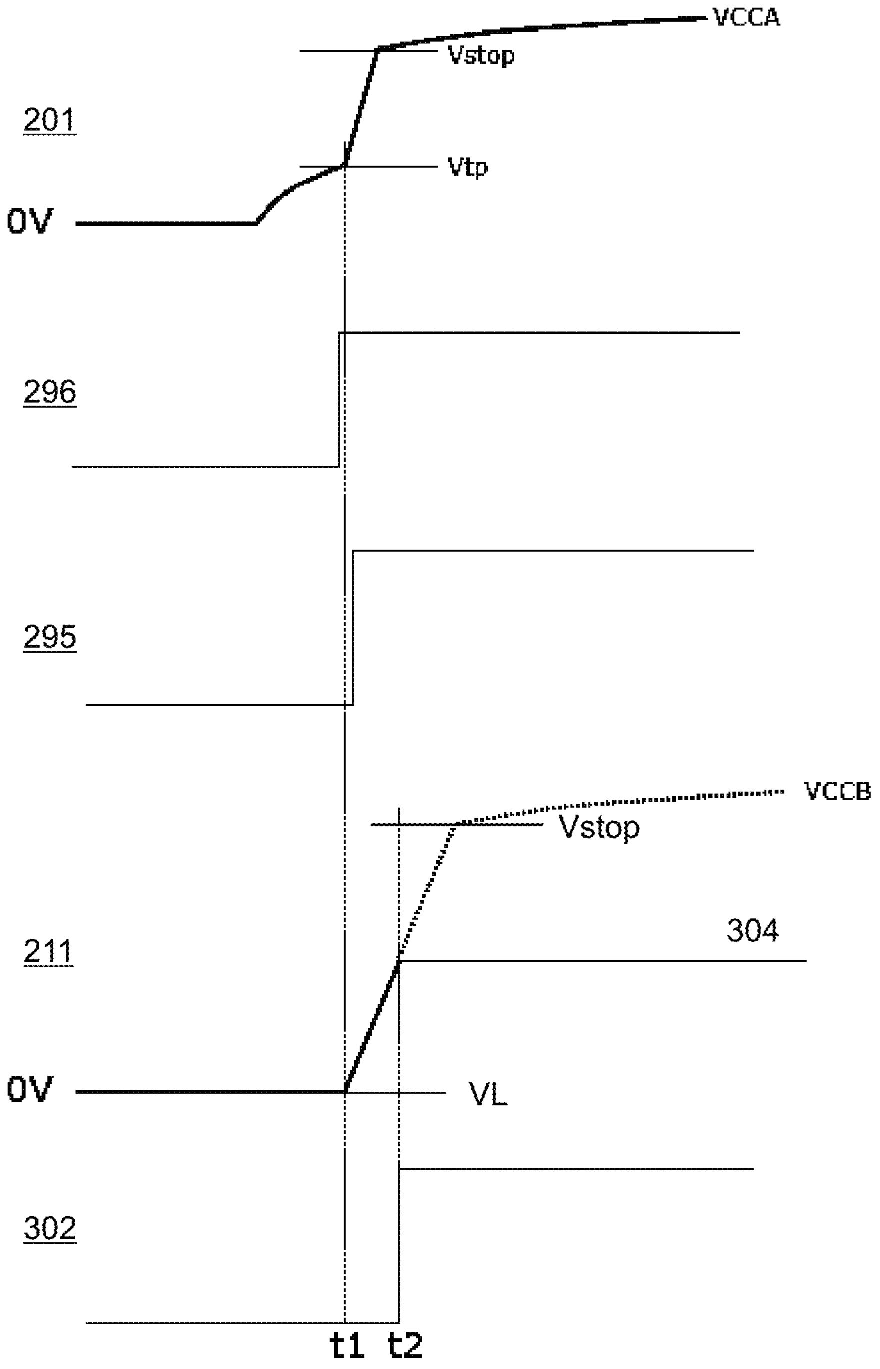
FIG. 3 and FIGS. 6-9 show graphs of voltage levels of various signals.

FIG. 3 shows an example of a signal propagation for low to high transition on the forward channel. Five signal graphs are shown, wherein the x-axes are aligned and indicate a time in any time unit and the y-axes indicate a signal strength in volt. The A-side terminal 201 can be released and pulled up with the resistor R1. Once the signal at the A-side terminal 201 (depicted '201' in FIG. 3) crosses the first threshold voltage, in FIG. 3 depicted 'Vtp', the A-side rise time accelerator element 204 can turn on when an Input_acc_A2B signal (depicted '296' in FIG. 2 and FIG. 3)

becomes high. The A-side rise time accelerator element 204, which in this example operates as an input accelerator, accelerates the signal on the A-side terminal 201 from the first threshold voltage Vtp to the second threshold voltage, in FIG. 3 depicted 'Vstop', e.g., from Vtp=42.5% of VCCA to Vstop=80% of VCCA. The B-side rise time accelerator 214, which now operates as output accelerator, can accelerate the signal on the B-side terminal 211 (depicted '211' in FIG. 3) from a level of VL to the second threshold level, e.g., from VL to Vstop=80% of VCCB, as a result of an Output_acc_A2B signal (depicted '295' in FIG. 2 and FIG. 3) becoming high.

A repeating unit with edge accelerators, such as the repeating unit 200 with rise time accelerator elements 204, 214, can encounter a problem of bus stuck at acknowledgement. This can happen when Master releases and Slave sends and an acknowledgement, which typically includes one bit represented by a VH signal. This has been illustrated in FIG. 3, where at the acknowledgement bit, Master releases the line. At t1 the voltage on the A-side terminal 201 crosses the first threshold voltage Vtp, and the input edge acceleration on the A-side terminal 201 and the output edge acceleration on the B-side terminal 211 start. At t2, Slave sends an acknowledgement by pulling the signal at the B-side terminal 211 low, in FIG. 3 shown as pull-down signal 302. Here, the B-side rise time accelerator 214 tries to pull the signal on the B-side terminal 211 to high, and at the same time, Slave tries to pull the signal on the B-side terminal 211 low. Since both rise time accelerator 214 and Slave are very strong, the signal at the B-side terminal 211 can settle at any voltage between VCCB and ground resulting into bus stuck and potentially dissipating huge current. In FIG. 3, an example of a bus stuck voltage is depicted '304'.

The bus stuck can be prevented by including an ACK detection mechanism in the controller unit 220, as further detailed in the following.

Figure 4:
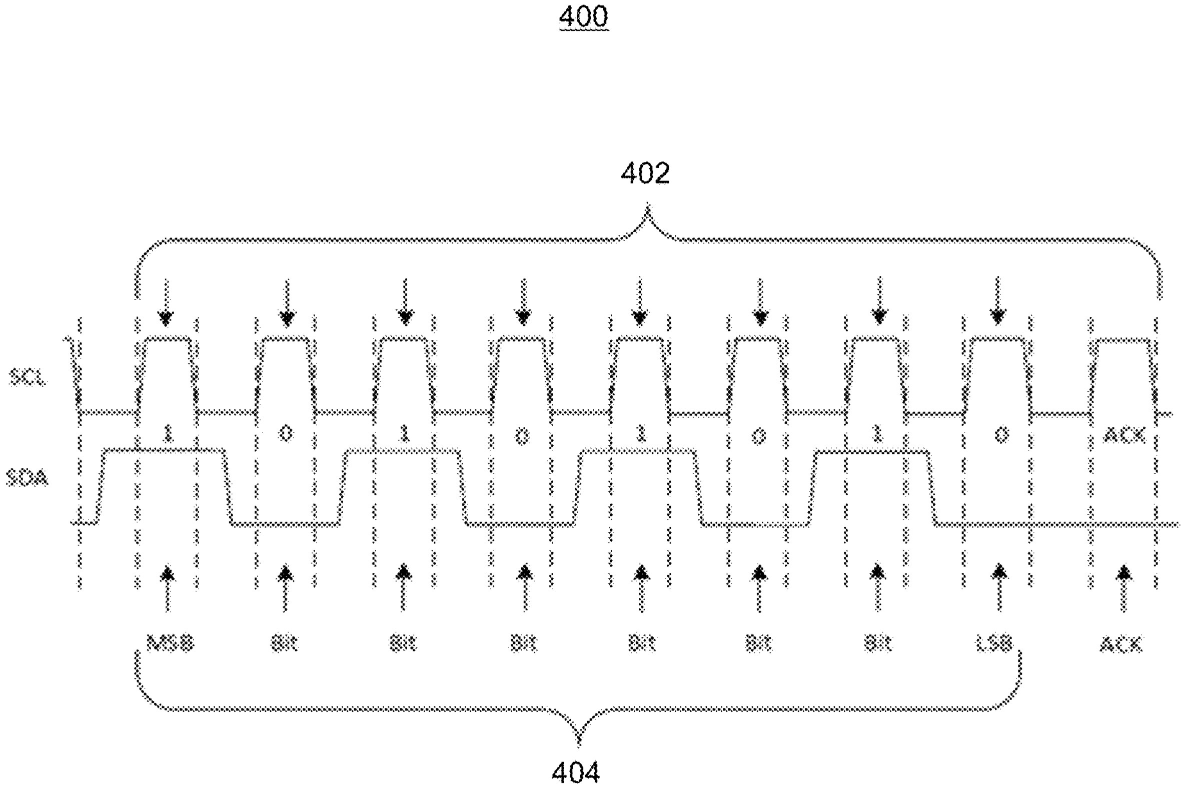
FIG. 4 shows an example I2C bit transfer.

I2C bit transfer typically includes handshake bits and non-handshake bits. Non-handshake bits are used where the communication is one direction, and the other end is in receiving mode. Handshake bits are used where one end of the repeating unit 200 releases and other end responds. FIG. 4 shows an example of an I2C bit transfer 400, wherein the most significant bit (MSB) of a data byte and the ACK bit are handshake bits, and other bits (depicted "Bit") including a least significant bit (LSB) are non-handshake bits. In FIG. 4, SCL is a serial clock (SCL) signal and SDA is a serial data (SDA) signal. In the shown period 402, the SDA line is stable (i.e., having a logical "1" or logical "0" value), while the SCL line is high (i.e., having a logical "1" value). In the example of FIG. 4, the I2C bit transfer includes a byte 404 of data representing a value of 1010 1010 (0xAAh) followed by an ACK bit.

Figure 5A:
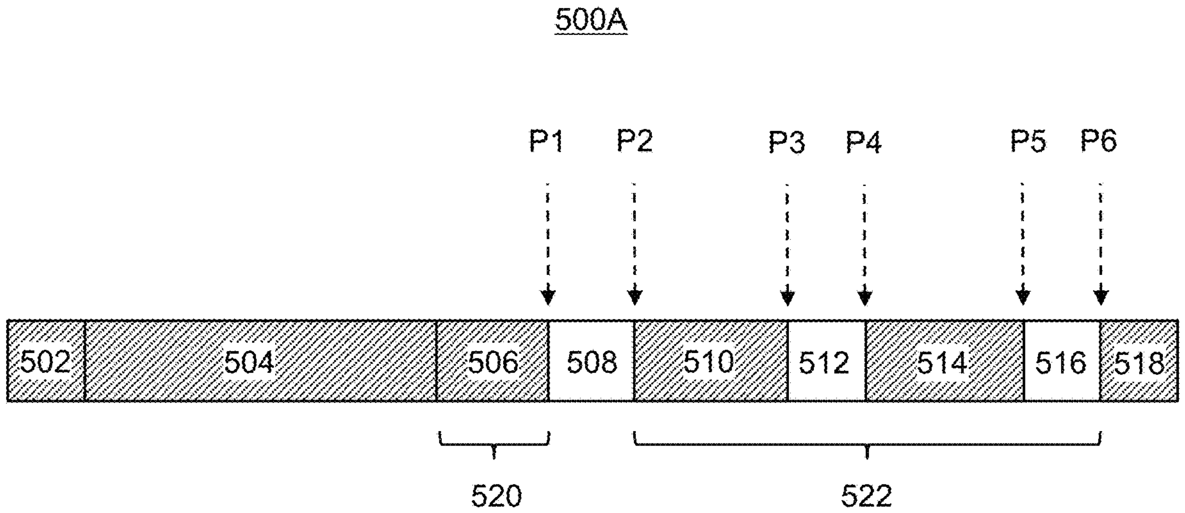
FIG. 5A and FIG. 5B illustrate data fields in an I2C bit transfer.

FIG. 5A shows an example portion of an I2C communication 500A, wherein a Master transmitter addresses a Slave receiver with a 7-bit address and a write operation. Timing of handshake bits are depicted P1, P2, P3, P4, P5, and P6. The I2C communication 500A typically includes a start condition 502, a Slave address 504, a read/write (R/$\overline{W}$) bit 506, a first ACK 508 (e.g., SDA LOW), first data 510, a second ACK 512 (e.g., SDA LOW), second data 514, an ACK (e.g., SDA LOW) or non-ACK (NACK, e.g., SDA HIGH) 516 and a stop condition 518. For the write operation, the value 520 of the R/$\overline{W}$ bit 506 is typically "0". The payload of the data transferred, including ACKs, is depicted 522. In FIG. 5A, the shaded portions (i.e., 502, 504, 506, 510, 514, and 518) represent data from Master to Slave, and the non-shaded portions (i.e., 508, 512, and 516) represent data from Slave to Master.

Figure 6:
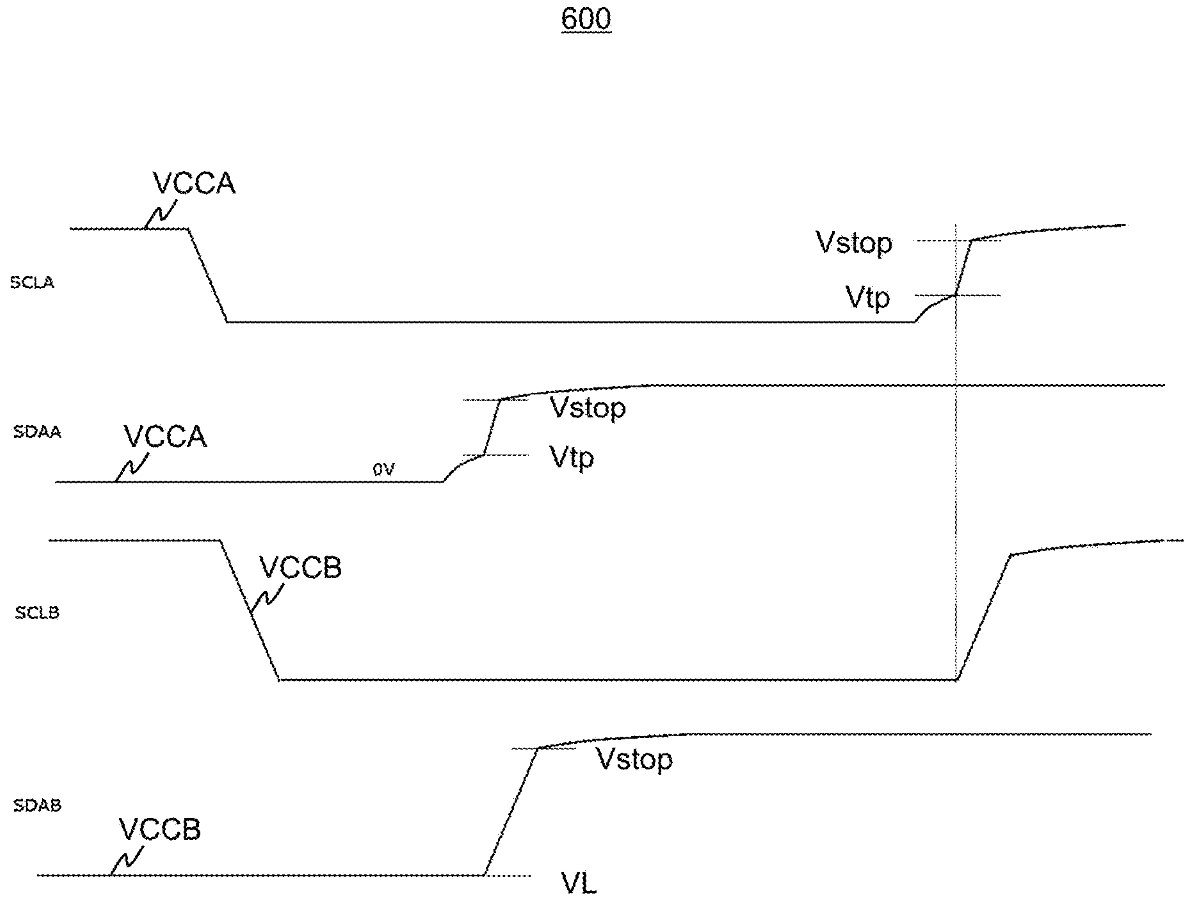

For non-handshake bits in a Master to Slave data transmission, the voltage levels 600 at various data lines SCLA, SDAA, SCLB, and SDAB can be as shown in FIG. 6. Herein, SCLA represents the SCL for the Master (e.g., for communication from the A-side to the B-side in FIG. 2), SCLB represents the SCL for the Slave (e.g., for communication from the B-side to the A-side in FIG. 2), SDAA represents the signal on the A-side terminal 201, and SDAB represents the signal on the B-side terminal 211. Vstop and Vtp levels can be similar to FIG. 3, e.g., 80% of VCC and 42.5% of VCC, respectively. In FIG. 6, the data changes from low to high during SCLA and SCLB are low state. Both edge accelerators boost the edges on all signals as shown in FIG. 6.

Figure 7:
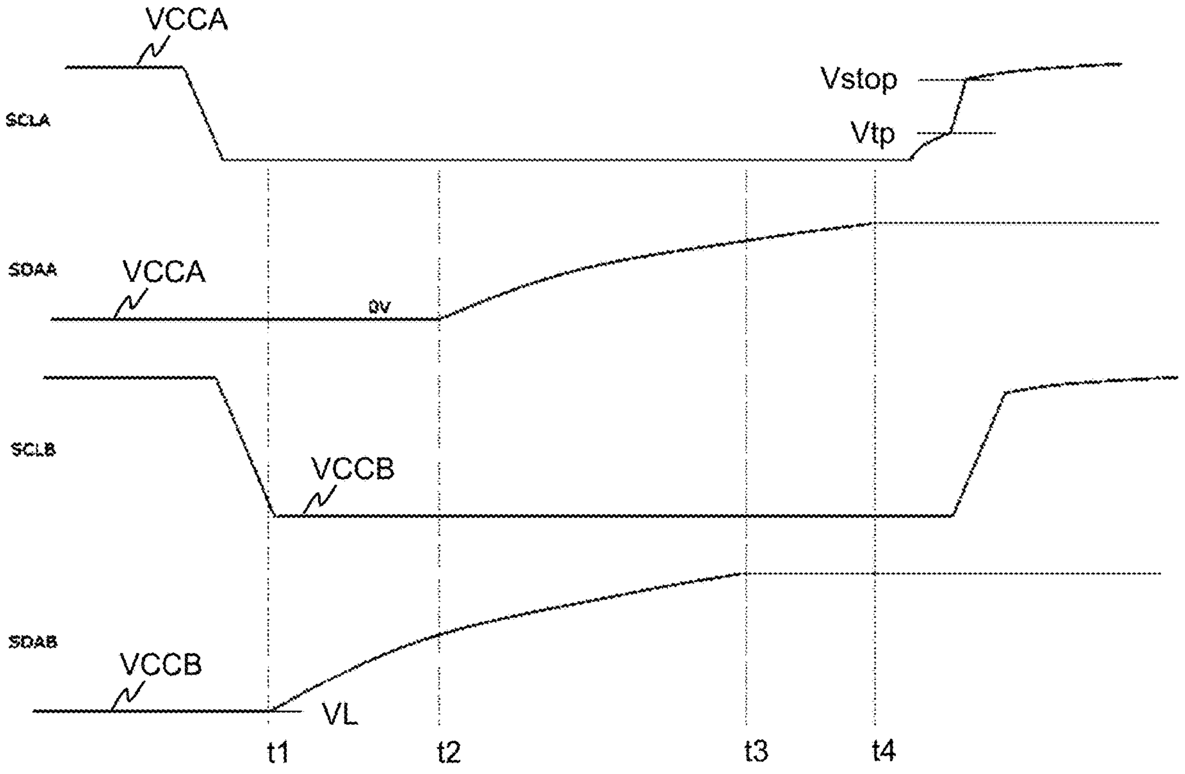

For handshaking bits consider a scenario at P1 as shown in FIG. 5A. ACK detection by the controller unit 220 can start after SCLB receives a high to low transition. SDAB is released by the repeating unit 200 at t1. In the example of FIG. 7, voltage levels 700 of the data lines SCLA, SDAA, SCLB SDAB are shown for a Slave sending NACK to Master. As the Slave doesn't send an ACK, Master releases SDAA, and as a result, both SDAA and SDAB sees high state before the next rising edge of SCLA and SCLB. Here, the repeating unit 200 takes a decision expecting a NACK from Slave so that the rising edge on SDAB only relies on a pull-up element, such as a pull-up resistor. The setup time at the Master and Slave interface is easily achieved as it does not depend on Slave to respond or Master to release, SDAB can use complete low state of SCLB and sees high state before the next rising edge.

Figure 8:
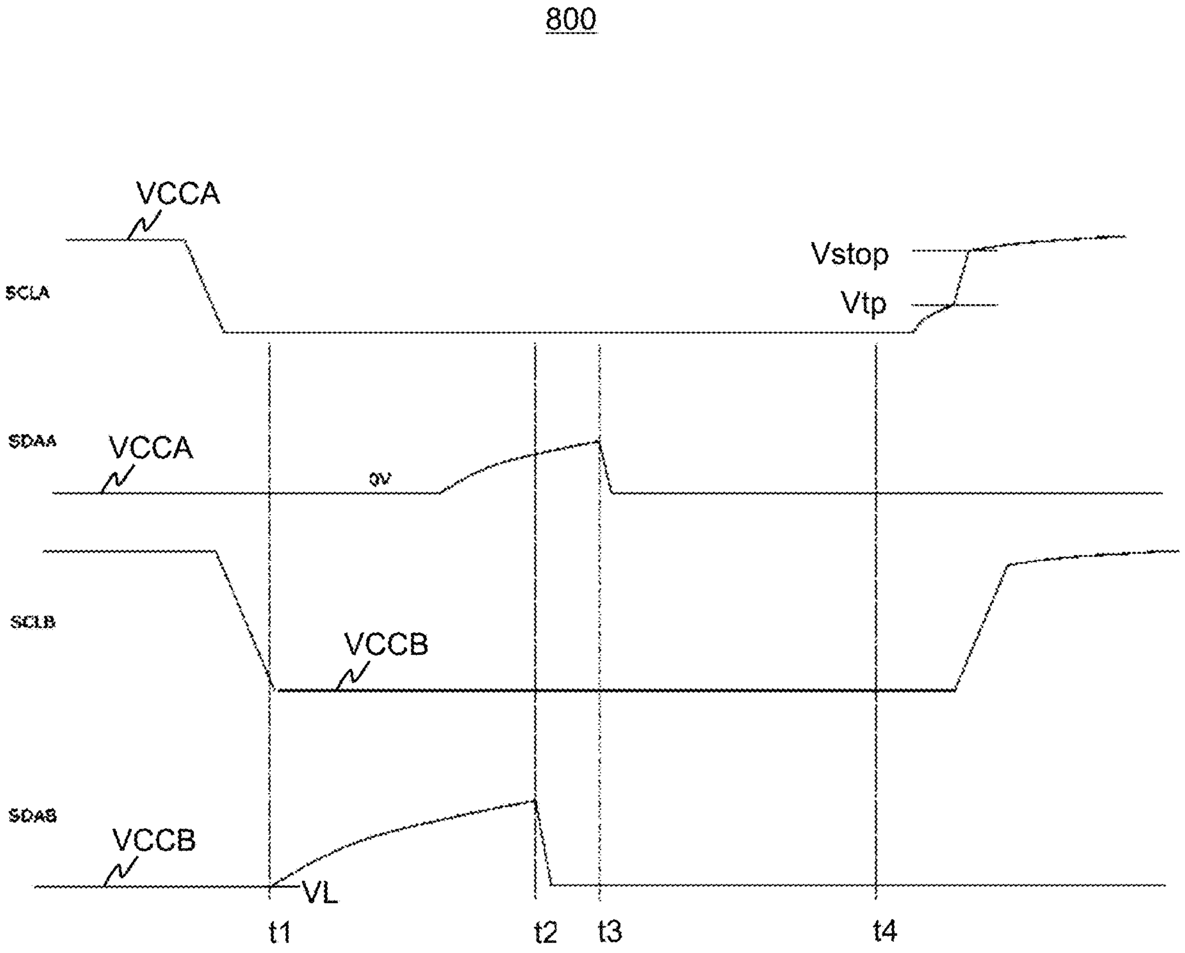

In the example of FIG. 8, voltage levels 800 of the data lines SCLA, SDAA, SCLB SDAB are shown for a Slave sending ACK to Master. If Slave sends an ACK at t2 on SDAB, it is pulled low externally. SDAA follows SDAB and Master sees the ACK. At the P1 interface, controller unit 220 can control the rise time accelerator elements 204, 214 on SDAA and SDAB to be disabled to avoid conflict between external pulling driver and rise time accelerators. Hereto, a disable signal 292, 293 can be transmitted from the controller unit 220 to the respective rise time accelerator element 204, 214. Thus, bus stuck can be prevented as the open drain driver from the Slave does not conflict with edge acceleration.

Figure 9:
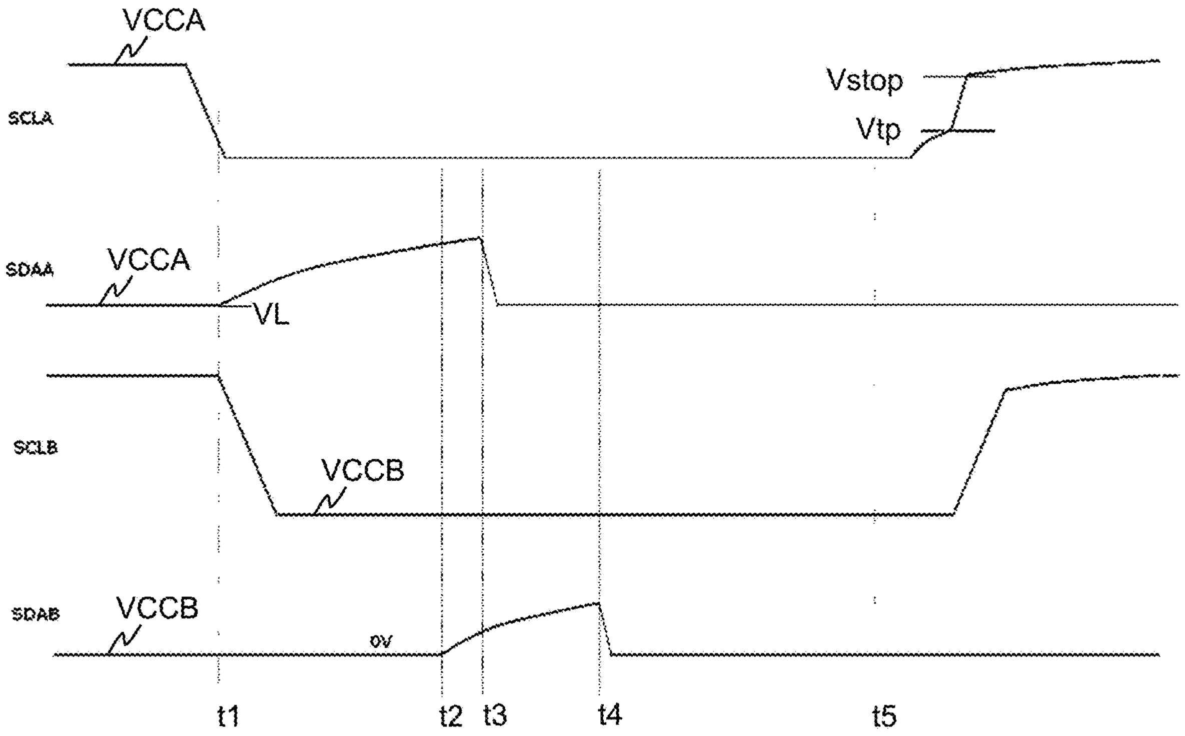

At P2, assuming there is an ACK from Slave, the direction of propagation is from Slave to Master during the ACK bit. If Master wants to send a Low (i.e., VL), the repeating unit 200 can react as shown in FIG. 9. In the example of FIG. 9, voltage levels 900 of the data lines SCLA, SDAA, SCLB SDAB are shown for a Master sending Low (i.e., VL) to Slave after an ACK bit. First, SDAA can be released by the repeating unit 200 at t1 as the controller unit 220 starts by predicting that Master wants to send High (i.e., VH) during the first bit. If Master sends a Low at t3, SDAB can follow Master at t4. As per I2C protocol, Slave releases the line at t2 and Slave receives the data from Master.

Figure 5B:
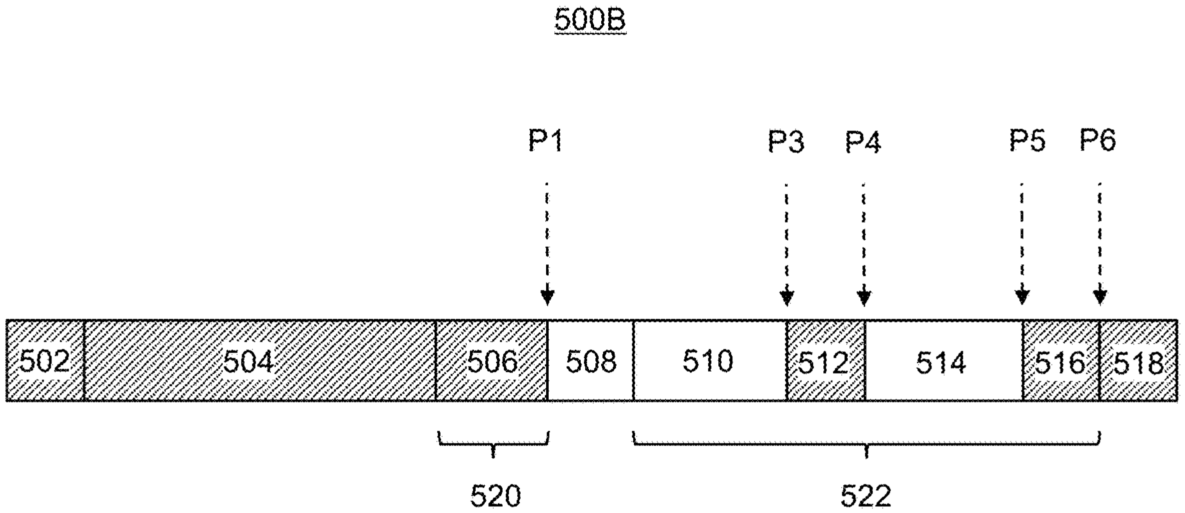

FIG. 5B shows an example portion of an I2C communication 500B, wherein a Master transmitter addresses a Slave receiver with a 7-bit address and a read operation. As in FIG. 5A, the shaded portions (in FIG. 5B: 502, 504, 506, 512, 516 and 518) represent data from Master to Slave and the non-shaded portions (in FIG. 5B: 508, 510 and 514) represent data from Slave to Master. For the read operation, the value 520 of the R/$\overline{W}$ bit 506 is typically "1". In FIG. 5B, field 516 includes a NACK bit. The read operation as shown in FIG. 5B is slightly different from write operation as shown in FIG. 5A. After the Slave address the Slave immediately sends data to Master, so there is no handshake after the ACK 508. Thus, only handshaking bits P1, P3, P4, P5 and P6 are present in the I2C communication 500B. After receiving the first byte of data, there is an ACK from Master to Slave at P3. Here, the handshake is from Slave to Master and at P4 the handshake is from Master to Slave.

Figure 10:
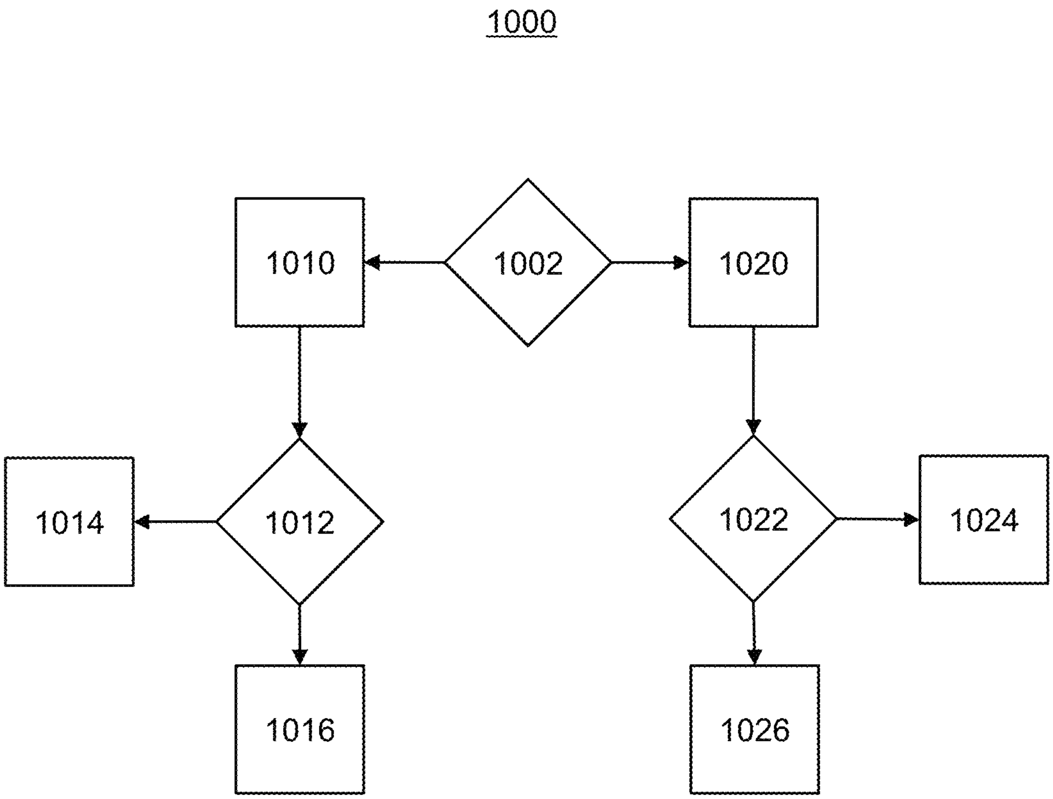
FIG. 10 is a flow chart of an example method of the present disclosure.

FIG. 10 shows an example process flow 1000 of a process performed by a controller unit, such as controller unit 220, for preventing bus stuck during handshaking. The process flow 1000 enables smart acceleration (i.e., rise time acceleration only when necessary and avoiding bus stuck) and direction control. For the smart acceleration, the controller unit 220 can generate the disable signal 292, 293 for disabling the rise time accelerators 204, 214 during handshaking. For the direction control, the controller unit 220 can generate the DIR_CTRL signal 298, 299 for controlling the direction control element 207, 217.

In step 1002, a controller unit, such as controller unit 220, can determine whether the I2C communication, such as I2C communication 500A of FIG. 5A or I2C communication 500B of FIG. 5B, is to perform a handshake from the A-side to the B-side of the repeating unit, such as repeating unit 200, or vice versa. The A-side can be defined Master and the B-side can be defined Slave. The controller unit 220 can receive an input signal 291 representative of the signal at the Master (e.g., the signal at the A-side terminal 201) and a clock input signal 290 to determine when the handshake is to be performed.

During the write operation of the example of FIG. 5A, handshake is performed from Master to Slave at P1, P3 and P5, i.e., during ACK bit 508, ACK bit 512 and ACK/NACK bit 516 from Slave to Master. During the read operation of the example of FIG. 5B, handshake is performed from Master to Slave at P1 and P4, i.e., during ACK bit 508 from Slave to Master and during the first bit of the read operation at data 514.

During the write operation of the example of FIG. 5A, handshake is performed from Slave to Master at P2 and P4, i.e., the first bit of the write operation at data 510 and data 514. During the read operation of the example of FIG. 5B, handshake is performed from Slave to Master at P3 and P5, i.e., during ACK bit 512 and ACK/NACK bit 516 from Master to Slave.

Depending on the direction of the handshake, steps 1010-1016 or steps 1020-1026 can be performed. In the example of FIG. 10, if it is determined that the handshake is to be performed from Master to Slave, then steps 1010-1016 are performed. If on the other hand it is determined that the handshake is to be performed from Slave to Master, then steps 1020-1026 are performed.

In step 1010, when handshaking from Master to Slave (i.e., during ACK bit 508, ACK bit 512 and ACK/NACK bit 516 of 500A, and during ACK bit 508 and the first bit of the read operation at data 514 of 500B) the controller unit 220 blocks communication from the A-side terminal 201 to the B-side terminal 211, e.g., by sending a DIR_CTRL signal to the B-side anti self locking flipflop 217. The repeating unit 200 can release the B-side terminal 211 after the falling edge of the clock signal of the B-side terminal 211.

In step 1010, for the handshaking the controller unit 220 further blocks edge acceleration on the rise time accelerator elements 204, 214 by sending a disable signal 292, 293 to the rise time accelerator elements 204, 214.

Optionally, the repeating unit can implement a delay timer at the end of step 1010 to avoid a potential glitch on the B-side terminal 211. The delay timer is, e.g., set to 160 ns, or any other suitable time value between 100 ns and 300 ns.

In step 1012, the status of the signal on the B-side terminal 211 is monitored and Slave to Master propagation is enabled. If the B-side terminal 211 is not driven from Slave (signal is high), the repeating unit 200 sends a high signal on the A-side terminal 201 in step 1014. If the B-side terminal 211 is driven from Slave (signal is low), acknowledgement from Slave is detected and a low signal is sent to the A-side terminal 201 in step 1016.

In step 1020, when handshaking from Slave to Master (i.e., during ACK bit 512 and NACK bit 516 of 500B, and during the first bit of the write operation at data 510 and data 514 of 500A) the controller unit 220 blocks communication from the B-side terminal 211 to the A-side terminal 201, e.g., by sending a DIR_CTRL signal to the A-side direction control element 207. The repeating unit 200 can release the A-side terminal 201 after the falling edge of the clock signal of the A-side terminal 201.

In step 1020, for the handshaking the controller unit 220 further blocks edge acceleration on the rise time accelerator elements 204, 214 by sending a disable signal 292, 293 to the rise time accelerator elements 204, 214.

Optionally, the repeating unit can implement a delay timer at the end of step 1020 to avoid a potential glitch on the A-side terminal 201. The delay timer is, e.g., set to 160 ns, or any other suitable time value between 100 ns and 300 ns.

In step 1022, the status of the signal on the A-side terminal 201 is monitored and Master to Slave propagation is enabled. If the A-side terminal 201 is not driven from Master (signal is high), the repeating unit 200 sends a high signal on the B-side terminal 211 in step 1024. Input acceleration on the B-side terminal 211 can be enabled to speed up the edge. If the A-side terminal 201 is driven from Master (signal is low), a low signal is sent to the B-side terminal 211 in step 1026.

The controller unit 220 can be configured to perform the following algorithm.

For handshaking from Master to Slave (this happens during acknowledgement from Slave or first bit of read operation):

Repeating unit blocks Master to slave direction;
Repeater releases SDAB after the falling edge of SCLB;
Repeater blocks edge accelerators on SDAA and SDAB;
Wait for 160 ns to avoid glitch on SDAB (optional);
Monitor the status of SDAB and enable Slave to Master propagation;
If SDAB is not driven from slave, send high signal on SDAA;
If SDAB is driven from Slave, ACK from slave is detected, send low signal to SDAB.

For handshaking from Slave to Master (this happens during acknowledgement from Master or first bit of write byte):

Repeater blocks Slave to Master;
Repeater releases SDAA at the falling edge of SCLA;
Repeater blocks edge accelerators on SDAA and SDAB;
Wait for 160 ns to avoid glitch on SDAA (optional);
Monitor the status of SDAA and enable Master to Slave propagation;
If SDAA is not driven from Master, send a high signal on SDAB, input acceleration on SDAB can be enabled to speed up the edge;
If SDAA is driven from Master, send a low signal to SDAB.

Figure 11:
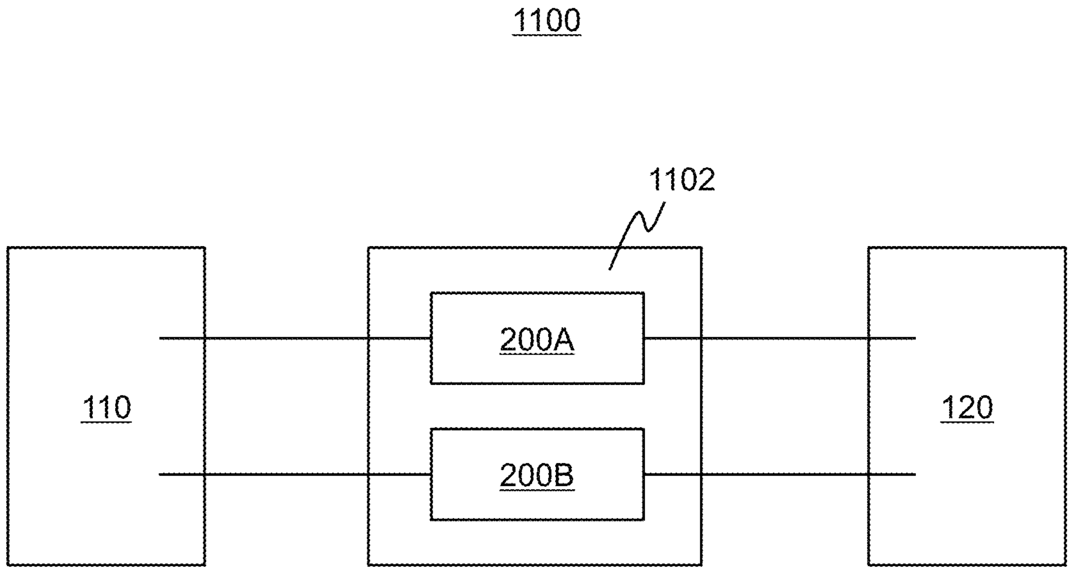
FIG. 11 is a schematic diagram of a system employing I2C bus communication according to an embodiment of the present disclosure.

FIG. 11 shows a system 1100 employing a bus repeater 1102. The bus repeater 1102 can include one or more repeating units, such as repeating unit 200. In the example of FIG. 11, the bus repeater 1102 includes two repeating units 200A, 200B. System 1100 can further include a first communication unit 110 and a second communication unit 120.

A-side terminal 201 of first repeating unit 200A can be connected to a data pin of first communication unit 110 via a respective bus line, and B-side terminal 211 of first repeating unit 200A can be connected to a data pin of second communication unit 120 via a respective bus line. Similarly, A-side terminal 201 of second repeating unit 200B can be connected to a clock pin of first communication unit 110 via a respective bus line, and B-side terminal 211 of second repeating unit 200B can be connected to a clock pin of second communication unit 120 via a respective bus line. In system 1100, communication between first and second communication unit 110, 120 can be performed based on the I2C protocol.

What is claimed is:

1. A repeating unit for open-drain bus communication, the repeating unit comprising:

an A-side terminal configured to be electrically connected to an A-side open-drain bus line; and a B-side terminal configured to be electrically connected to a B-side open-drain bus line, wherein the repeating unit is operable in a first mode in which the repeating unit is configured to receive a signal at the A-side terminal and to produce a signal at the B-side terminal based on the signal received at the A-side terminal;

a B-side rise time accelerator element electrically connected to the B-side terminal; and a controller unit, wherein the controller unit is configured to, when the repeating unit is operating in the first mode, control the B-side rise time accelerator element to pull up a voltage at the B-side terminal when the voltage at the A-side terminal surpasses a first threshold voltage during a rising edge of the voltage, and to subsequently control the B-side rise time accelerator element to stop pulling up the voltage at the B-side terminal when the voltage at the B-side terminal surpasses a second threshold voltage, and wherein the controller unit is further configured to disable the B-side rise time accelerator element when sending or receiving a handshake bit.

2. The repeating unit according to claim 1, further comprising:

an A-side rise time accelerator element electrically connected to the A-side terminal, wherein the repeating unit is operable in a second mode in which the repeating unit is configured to receive a signal at the B-side terminal and to produce a signal at the A-side terminal based on the signal received at the B-side terminal, wherein the controller unit is further configured to, when the repeating unit is operating in the second mode, control the A-side rise time accelerator element to pull up a voltage at the A-side terminal when the voltage at the B-side terminal surpasses a third threshold voltage during a rising edge of the voltage, and to subsequently control the A-side rise time accelerator element to stop pulling up the voltage at the A-side terminal when the voltage at the A-side terminal surpasses a fourth threshold voltage, and wherein the controller unit is further configured to disable the A-side rise time accelerator element when sending or receiving a handshake bit.

3. The repeating unit according to claim 2, further comprising:

a direction control element, wherein the controller unit is configured to determine whether the repeating unit is operating in the first mode or the second mode, and wherein the controller unit is further configured to control the direction control element to block communication from the B-side terminal to the A-side terminal in the first mode and block communication from the A-side terminal to the B-side terminal in the second mode.

4. A repeating unit according to claim 1, wherein the repeating unit is an inter-integrated circuit (I2C) repeating unit.

5. A bus repeater comprising one or more repeating units, wherein at least one of the repeating units comprises:

an A-side terminal configured to be electrically connected to an A-side open-drain bus line; and a B-side terminal configured to be electrically connected to a B-side open-drain bus line, wherein the repeating unit is operable in a first mode in which the repeating unit is configured to receive a signal at the A-side terminal and to produce a signal at the B-side terminal based on the signal received at the A-side terminal;

the repeating unit further comprising:

a B-side rise time accelerator element electrically connected to the B-side terminal; and a controller unit, wherein the controller unit is configured to, when the repeating unit is operating in the first mode, control the B-side rise time accelerator element to pull up a voltage at the B-side terminal when the voltage at the A-side terminal surpasses a first threshold voltage during a rising edge of the voltage, and to subsequently control the B-side rise time accelerator element to stop pulling up the voltage at the B-side terminal when the voltage at the B-side terminal surpasses a second threshold voltage, and wherein the controller unit is further configured to disable the B-side rise time accelerator element when sending or receiving a handshake bit.

6. A system comprising:

a bus repeater comprising a first repeating unit and a second repeating unit, wherein at least one of the first repeating unit and the second repeating unit comprises:

an A-side terminal configured to be electrically connected to an A-side open-drain bus line; and a B-side terminal configured to be electrically connected to a B-side open-drain bus line, wherein the repeating unit is operable in a first mode in which the repeating unit is configured to receive a signal at the A-side terminal and to produce a signal at the B-side terminal based on the signal received at the A-side terminal;

the repeating unit further comprising:

a B-side rise time accelerator element electrically connected to the B-side terminal; and a controller unit, wherein the controller unit is configured to, when the repeating unit is operating in the first mode, control the B-side rise time accelerator element to pull up a voltage at the B-side terminal when the voltage at the A-side terminal surpasses a first threshold voltage during a rising edge of the voltage, and to subsequently control the B-side rise time accelerator element to stop pulling up the voltage at the B-side terminal when the voltage at the B-side terminal surpasses a second threshold voltage, and wherein the controller unit is further configured to disable the B-side rise time accelerator element when sending or receiving a handshake bit;

a first communication unit;

a second communication unit;

an A-side terminal of the first repeating unit connected to a data pin of the first communication unit via a first bus line;

a B-side terminal of the first repeating unit connected to a data pin of the second communication unit via a second bus line;

an A-side terminal of the second repeating unit connected to a clock pin of the first communication unit via a third bus line; and a B-side terminal of the second repeating unit connected to a clock pin of the second communication unit via a fourth bus line.

7. A method of transmitting a handshake in an inter-integrated circuit, I2C, based communication in a repeating unit, the repeating unit comprising an A-side terminal acting as Master and a B-side terminal acting a Slave, the method comprising:

determining that a handshake is to be performed from Master to Slave, and if this has been determined:

blocking communication from Master to Slave; and blocking edge acceleration of signals on the A-side terminal and the B-side terminal of the repeating unit.

8. The method according to claim 7, further comprising:

after blocking the edge acceleration, monitoring a status of the B-side terminal and enabling Slave to Master propagation;

sending a high signal on the A-side terminal if the B-side terminal is not driven from Slave; and sending a low signal to the A-side terminal and determine that an acknowledgement is detected from Slave if the B-side terminal is driven from Slave.

9. The method according to claim 8, further comprising:

determining that a handshake is to be performed from Slave to Master, and if this has been determined:

blocking communication from Slave to Master; and blocking edge acceleration of signals on the A-side terminal and the B-side terminal of the repeating unit.

10. The method according to claim 9, further comprising:

after blocking the edge acceleration, expiring a delay timer before monitoring the status of the A-side terminal or the B-side terminal.

11. The method according to claim 8, further comprising:

after blocking the edge acceleration, expiring a delay timer before monitoring the status of the A-side terminal or the B-side terminal.

12. The method according to claim 7, further comprising:

determining that a handshake is to be performed from Slave to Master, and if this has been determined:

blocking communication from Slave to Master; and blocking edge acceleration of signals on the A-side terminal and the B-side terminal of the repeating unit.

13. The method according to claim 12, further comprising:

after blocking the edge acceleration, monitoring a status of the A-side terminal and enable Master to Slave propagation;

sending a high signal on the B-side terminal if the A-side terminal is not driven from Master; and sending a low signal to the B-side terminal if the A-side terminal is driven from Master.

14. The method according to claim 13, wherein the delay timer is set to 160 ns.

15. The method according to claim 12, further comprising:

after blocking the edge acceleration, expiring a delay timer before monitoring the status of the A-side terminal or the B-side terminal.

* * * * *